United States Patent
Erickson et al.

(10) Patent No.: US 8,395,186 B2
(45) Date of Patent: Mar. 12, 2013

(54) IMPLEMENTING VERTICAL SIGNAL REPEATER TRANSISTORS UTILIZING WIRE VIAS AS GATE NODES

(75) Inventors: Karl R. Erickson, Rochester, MN (US); Phil C. Paone, Rochester, MN (US); David P. Paulsen, Dodge Center, MN (US); John E. Sheets, II, Zumbrota, MN (US); Gregory J. Uhlmann, Rochester, MN (US); Kelly L. Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 94 days.

(21) Appl. No.: 13/005,059

(22) Filed: Jan. 12, 2011

(65) Prior Publication Data

US 2012/0175624 A1 Jul. 12, 2012

(51) Int. Cl.
*H01L 21/00* (2006.01)

(52) U.S. Cl. ........ 257/156; 438/153; 257/328; 257/330; 257/332

(58) Field of Classification Search .............. 257/66–67, 257/69, 328–330, 332, 350–351, E29.262; 438/153, 156
See application file for complete search history.

(56) References Cited

U.S. PATENT DOCUMENTS

| 5,208,172 A * | 5/1993 | Fitch et al. ............... 438/272 |
| 2003/0136978 A1 * | 7/2003 | Takaura et al. ............... 257/210 |
| 2007/0194450 A1 | 8/2007 | Tyberg et al. |

OTHER PUBLICATIONS

"Implementing Semiconductor SOC With Metal Via Gate Node High Performance Stacked Transistors", U.S. Appl. No. 13/005,089, filed the same day herewith, by Karl Robert Erickson et al.

* cited by examiner

*Primary Examiner* — Tucker Wright
(74) *Attorney, Agent, or Firm* — Joan Pennington

(57) ABSTRACT

A method and structures are provided for implementing vertical transistors utilizing wire vias as gate nodes. The vertical transistors are high performance transistors fabricated up in the stack between the planes of the global signal routing wire, for example, used as vertical signal repeater transistors. An existing via or a supplemental vertical via between wire planes provides both an electrical connection and the gate node of the novel vertical transistor.

6 Claims, 7 Drawing Sheets

IMPLEMENTING VERTICAL SIGNAL REPEATER TRANSISTORS UTILIZING WIRE VIAS AS GATE NODES

FIELD OF THE INVENTION

The present invention relates generally to integrated circuit field, and more particularly, relates to a method and structures for implementing vertical signal repeater transistors utilizing wire vias as gate nodes in a back end of line (BEOL) of a semiconductor chip.

DESCRIPTION OF THE RELATED ART

As the content and most importantly the processor or core count as well as the core to core communication bandwidth requirements on a chip die grows the fundamental limit to integration tends to be in the wiring planes.

Modern semiconductor chips, operating at very high frequencies, often have signal paths that have to drive significantly long distances from a first circuit to a second circuit on the chip. Unfortunately, chip wiring is quite resistive as well as capacitive, and therefore long chip signal routing may cause unacceptable delays and signal degradation. To reduce effects of the resistive and capacitive effects, long signal paths are often broken up into segments, with buffers or signal repeaters between segments. Long wiring routes are typically provided on relatively high wiring levels or many wiring levels above the chip silicon substrate. Via stacks route wiring segments up to the high wiring level and back down again to buffers or signal repeaters, or a destination circuit, on the silicon substrate. Via stacks are quite resistive and create delays in buffered, segmented, long signal routes.

Of particular concern are long and broad communication channels that require a significant number of signal repeaters as the signal traverses down the wire path between distant cores. The connection from the long wire down to and back from transistor repeaters down in the silicon plane are extremely problematic as the intervening planes all must be utilized to reach the silicon plane. These vertical wire topologies tie up significant wire resources together with adding significant impedance to the path, often exceeding the long wire resistance or the repeater impedance itself.

U.S. patent application Publication No. 2007/0194450 published on Aug. 23, 2007 to Tyberg et al., and assigned to the present assignee, discloses structures and a fabrication process for incorporating thin film transistors in back end of the line (BEOL) interconnect structures. The structures and fabrication processes described are compatible with processing requirements for the BEOL interconnect structures. The structures and fabrication processes utilize existing processing steps and materials already incorporated in interconnect wiring levels in order to reduce added cost associated with incorporating thin film transistors in the these levels. The structures enable vertical (3D) integration of multiple levels with improved manufacturability and reliability as compared to prior art methods of 3D integration.

A need exists for an effective mechanism for implementing high performance transistor fabrication up in the stack between the planes of the global signal routing wire.

SUMMARY OF THE INVENTION

Principal aspects of the present invention are to provide a method and structures for implementing vertical signal repeater transistors utilizing wire vias as gate nodes. Other important aspects of the present invention are to provide such method and structures substantially without negative effects and that overcome many of the disadvantages of prior art arrangements.

In brief, a method and structures are provided for implementing vertical transistors utilizing wire vias as gate nodes. The vertical transistors are high performance transistors fabricated up in the stack between the planes of the global signal routing wire, for example, used as vertical signal repeater transistors. An existing via or a supplemental vertical via between wire planes provides both an electrical connection and the gate node of the novel vertical transistor.

In accordance with features of the invention, enhanced transistor fabrication is provided utilizing an easily controlled vertical structure. The transistor channel length is delineated by the deposition of doped silicon with sequential source, channel and drain depositions. This allows extremely tight tolerances and affords a far more aggressive nominal transistor design point.

In accordance with features of the invention, the vertical transistors include high performance N-channel field effect transistors (NFETs) and P-channel field effect transistors (PFETs) created in the back end of the line (BEOL) portion of a semiconductor chip.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Signals on modern semiconductor chips that must travel relatively long distances, such as a millimeter or more, are becoming performance limiting factors as data processing circuitry on the chips becomes faster. Signal wiring on chips tends to be quite resistive, with distributed capacitance, as well as what is typically a lumped capacitive load at the receiving end of the signal wiring. Signals are both delayed and degraded when travelling along such a resistive-capacitive signal wire. The usual technique to minimize total signal delay on a long route has been to buffer the signal one or more times along the route. Modern semiconductor chips may have twelve, or more wiring levels above the silicon substrate. Vias to take a signal up, and back down twelve or more wiring levels amounts to a large resistance, since vias are relatively resistive.

In an exemplary technology, a signal wire on an 8$^{th}$ level wiring level may be, with worst case process conditions, 0.3 ohms/micron. A 500 micron signal wire would therefore have 150 ohms of resistance. A via between wiring levels might be, worst case, 34 ohms. Typically, redundant vias are used; for example, four vias between the wider wires on higher-up wiring levels and two vias between the narrower wires on wiring levels nearer the silicon substrate. Contacts to the silicon levels may be 400 ohms and are typically two contact redundant. A via stack up to the 8$^{th}$ level may be as much as approximately 400 ohms, which is larger than the 150 ohms of the 500 micron signal wire. Then, to get back down to a buffer circuit is another 400 ohms. Buffers or signal repeaters placed near the 8$^{th}$ level (again using the 8$^{th}$ level only for example) would reduce the resistance by 800 ohms. Longer wiring routes on the 8$^{th}$ level could be used for the same total resistance, or, resistance between buffers can be dramatically reduced by placing buffers near the 8$^{th}$ wiring level.

Figure 7:
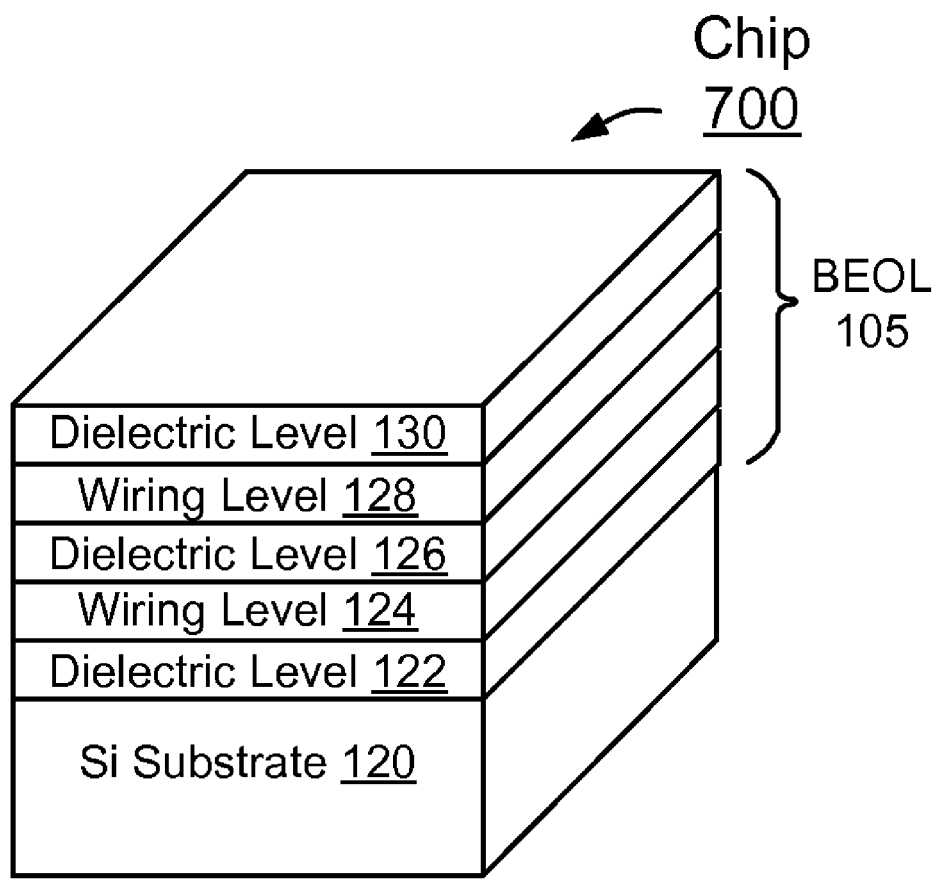
FIG. 7 shows a semiconductor chip having a silicon substrate and a plurality of dielectric levels and wiring levels, the plurality of dielectric levels and wiring levels forming a global wiring region used for implementing vertical transistors in accordance with the preferred embodiment.

Referring also to FIG. 7 there is shown an example semiconductor chip 700 having a silicon substrate 120 and a back end of the line (BEOL) 105 including a plurality of dielectric levels 122, 126, 130 and a plurality of wiring levels 124, 128 sandwiched in between the dielectric levels. The plurality of dielectric levels 122, 126, 130 and wiring levels 124, 128 forms a global wiring region advantageously used for implementing vertical transistors in accordance with the preferred embodiment. Although only three dielectric levels and two wiring levels are shown for simplicity, it should be understood that modern semiconductor chips may have twelve or more wiring levels.

Figure 1:
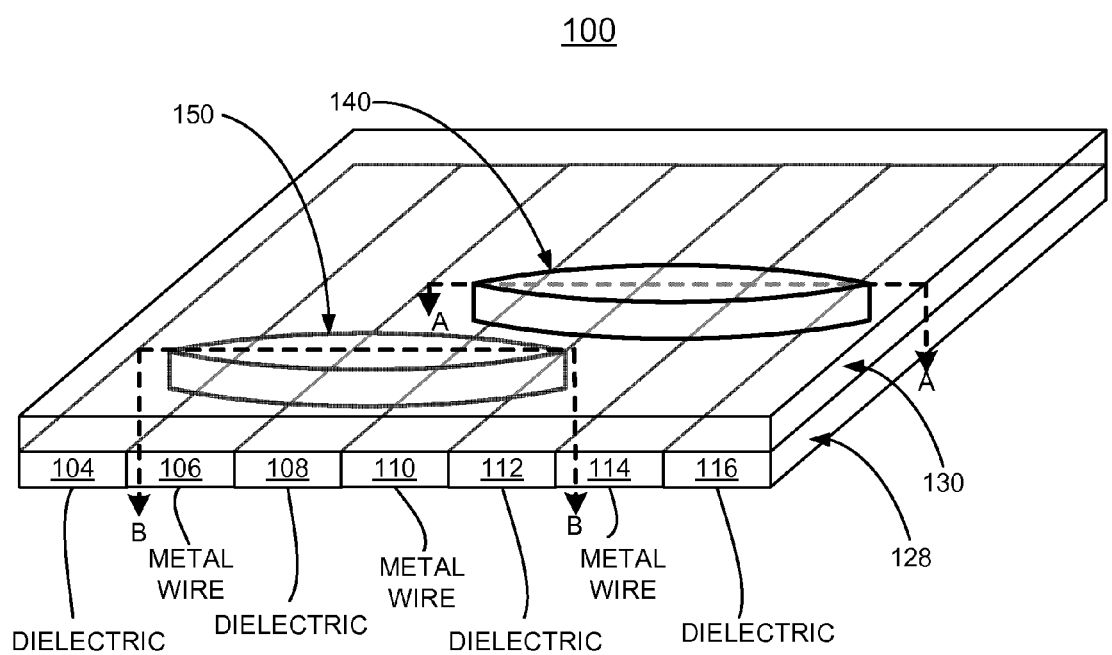
FIG. 1 shows an isometric view of a wiring level of a semiconductor chip, a dielectric level, and a pair of metal-metal device openings extending through the dielectric level with a respective cross section line indicates a cross section used in subsequent figures for implementing vertical transistors utilizing wire vias as gate nodes in accordance with the preferred embodiment.

Referring now to FIG. 1, there is shown an isometric view of example global signal routing planes generally designated by the reference character 100 in accordance with the preferred embodiment. The global signal routing planes 100 include the wiring level 128 being defined, and one or more dielectrics deposited between metal N and N+1 per typical processing to provide the dielectric level 130. A pair of metal-metal device openings or holes 140, 150 are etched extending through the dielectric level to the wiring level 128 with a respective cross section line A-A, B-B indicating a cross section used in subsequent figures for implementing NFET vertical transistors and PFET vertical transistors utilizing wire vias as gate nodes in accordance with the preferred embodiment. Each of the NFET metal-metal device and PFET metal-metal device openings or holes 140, 150 are a generally large; for example, approximately 0.10 micrometer (µm)-0.25 µm opening in the dielectric 130, a subset of the area ultimately to be the N to N+1 metal signal via and a second subset over one existing ground wire, also on level N.

In accordance with features of the invention, polycrystalline depositions are utilized in the physical plane of copper or refractory metal vias to form field effect transistors suitable for wire signal repeating, design error correction (EC), or other logical functions without the use of silicon level transistors and eliminating the need for the nominally required vertical stack of wires and vias down to and back up from the silicon level providing connections to conventional silicon level transistors.

The present invention enables generally high performance transistor fabrication up in the stack between the planes of the global signal routing wire. The high performance transistor fabrication utilizes the existing or a supplemental vertical via extending between wire planes as both an electrical connection and the gate node of the novel vertical transistor of the invention. This invention provides an enhanced transistor by utilizing a more easily controlled vertical structure.

The BEOL wiring level 128 includes a plurality of signal conductors or metal wires 106, 110, 114 with includes a plurality of adjacent dielectric material spacers 104, 108, 112, 116. The signal conductors or metal wires 106, 110, 114 are formed of any suitable electrically conductive material, for example, of Cu, Al, Al (Cu), and W. The dielectric material spacers 104, 108, 112, 116 are formed of any suitable dielectric material compatible with the semiconductor fabrication process, which may be silicon dioxide SiO2 or a low-K dielectric, depending on a particular process selected for fabricating the silicon chip 700 as shown in FIG. 7.

The BEOL wiring level 128 as shown in FIG. 1 illustrates a typical on die global wire route like those used between distinct cores on a system on a chip (SoC), utilizing a wire plane "N" running horizontally and "N+1" while running vertically over the semiconductor surface. The via electrically connecting planes N and N+1 is our focus here with the via used to form one of our transistor nodes, namely the gate of the respective NFET formed in opening 140 and the gate of the respective PFET formed in opening 150.

Figure 2:
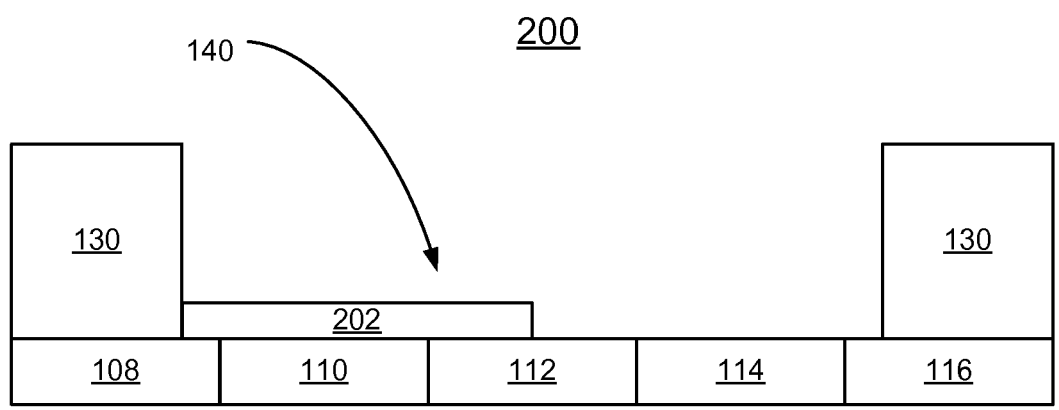
FIGS. 2, 3, 4, 5, and 6 illustrate exemplary processing steps for fabricating vertical transistors utilizing wire vias as gate nodes in accordance with the preferred embodiment.
Figure 3:
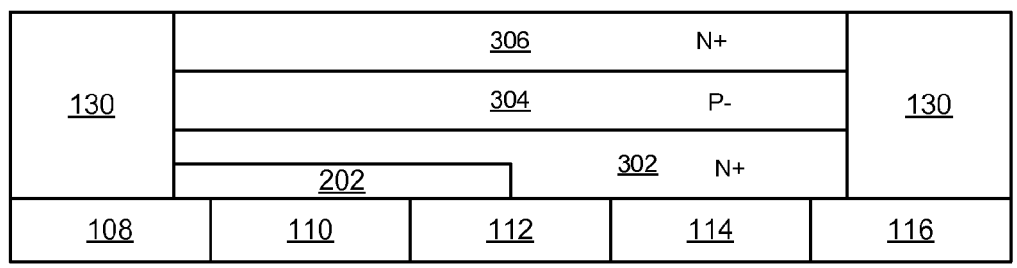
Figure 4:
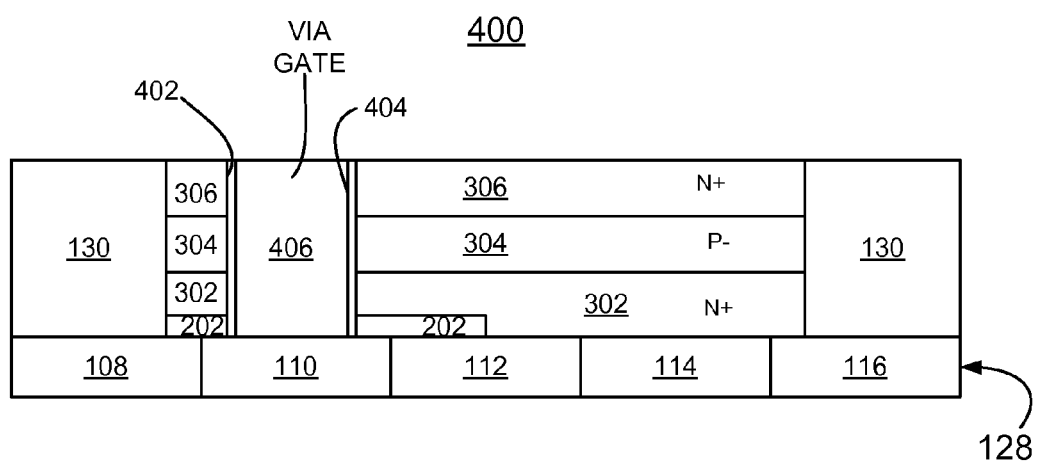

FIGS. 2, 3, 4, 5, and 6 illustrate exemplary further process steps for fabricating vertical transistors utilizing wire vias as gate nodes in accordance with the preferred embodiment. Only the NFET or PFET can be etched at once. NFET processing is shown in FIGS. 2, 3, 4, and repeated for the PFET, shown in FIG. 5.

Referring to FIG. 2, processing steps generally designated by the reference character 200 begin with the etched hole 140 created over two signal conductors or metal wires 110, 114, being etched through dielectric level 130 as illustrated in FIG. 1. A timed etch determines depth of etched hole 140. A relatively thin dielectric 202 is deposited to be selectively patterned to prevent shorting of the bottom of the polycrystalline stack to the N metal signal wire 110.

In accordance with features of the invention, polycrystalline depositions including polysilicon depositions and epitaxial depositions or other semiconductor deposition techniques and including other suitable semiconductor materials are utilized in the transistor fabrication process. The transistor channel length is delineated by the deposition of doped silicon with sequential source, channel and drain depositions. This allows extremely tight tolerances and affords us a far more aggressive nominal transistor design point. The vertical transistor fabrication advantageously starts with a relatively thin, polysilicon deposition, as a seed layer deposition then is switched to an epitaxial deposition to enhance the crystalline properties of the semiconductor, most importantly in the channel region.

Referring to FIG. 3, in processing steps generally designated by the reference character 300 a N+ doped polysilicon 302 of thickness on the order of 0.1 µm is deposited, defining an NFET source or N Source, a P− doped polysilicon 304 of thickness on the order of 0.05 µm is deposited, defining an NFET body or N body, and a N+ doped polysilicon 306 of thickness on the order of 0.1 µm is deposited, defining an NFET drain or N Drain.

Referring to FIG. 4, in processing steps generally designated by the reference character 400 a via opening 402 is etched down to the wiring level 128 the N level signal wire 110, a thin (20-30 Angstrom) dielectric 404 is deposited in the via opening 402, then anisotropically blanket etching of the dielectric from the bottom of via to signal wire 110; removing only a subset of the dielectric 404 on the sidewalls, and a via gate 406 defined by a selected metal fill 406 is deposited in the via opening 402, such as copper or desired other metal. Optionally, the PFET processing steps are provided as shown in FIG. 5, before the NFET via gate processing steps 400.

Figure 5:
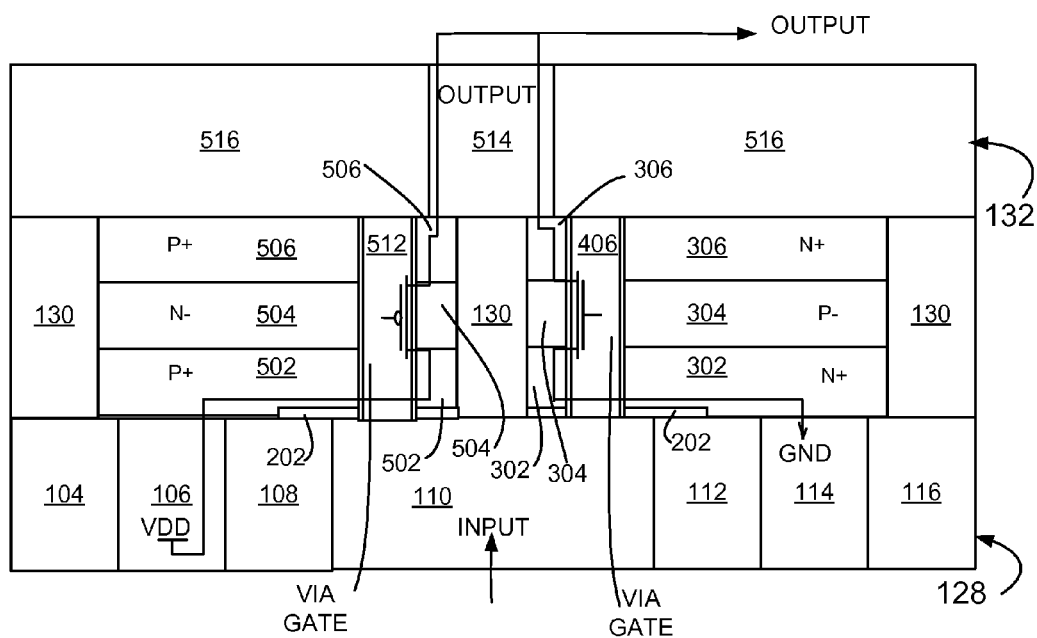

Referring to FIG. 5, there are shown processing steps generally designated by the reference character 500 with a final device schematic overlay. In processing steps 500 a P+ doped polysilicon 502 of thickness on the order of 0.1 µm is deposited, defining a PFET source or P Source, a N− doped polysilicon 504 of thickness on the order of 0.05 µm is deposited, defining a PFET body or P body, and a P+ doped polysilicon 506 of thickness on the order of 0.1 µm is deposited, defining a PFET drain or P Drain; and a via gate 512 defined by a selected metal fill 512 for the PFET. The polysilicon outside the intended NFET opening 140 and PFET opening 150 as shown in FIG. 1 is polished off, and then the via gate 406, and via gate 512 are deposited, as described with respect to FIG. 4. A mask pattern is provided to remove silicon above the output N drain 306 as shown in FIG. 5, and P drain 506 on a subset of the polysilicon donut, and a dielectric 516 is added above the N drain 306 of the NFET polysilicon stack past gate via 406, and above the P drain 506 of the PFET polysilicon stack past gate via 512, in a next wiring level 132 above the wiring level 128 to prevent shorting to the top of the polysilicon stack films. NFET source connection 302 is made to an existing GND rail metal 114 in the wiring level 128, and NFET drain connection 306 is made to an output signal node metal 514 in the wiring level 132. PFET source connection 502 is made to existing Vdd source metal 106 in the wiring level 128, and PFET drain connection 506 is made to the output signal node metal 514 in the wiring level 132.

Figure 6:
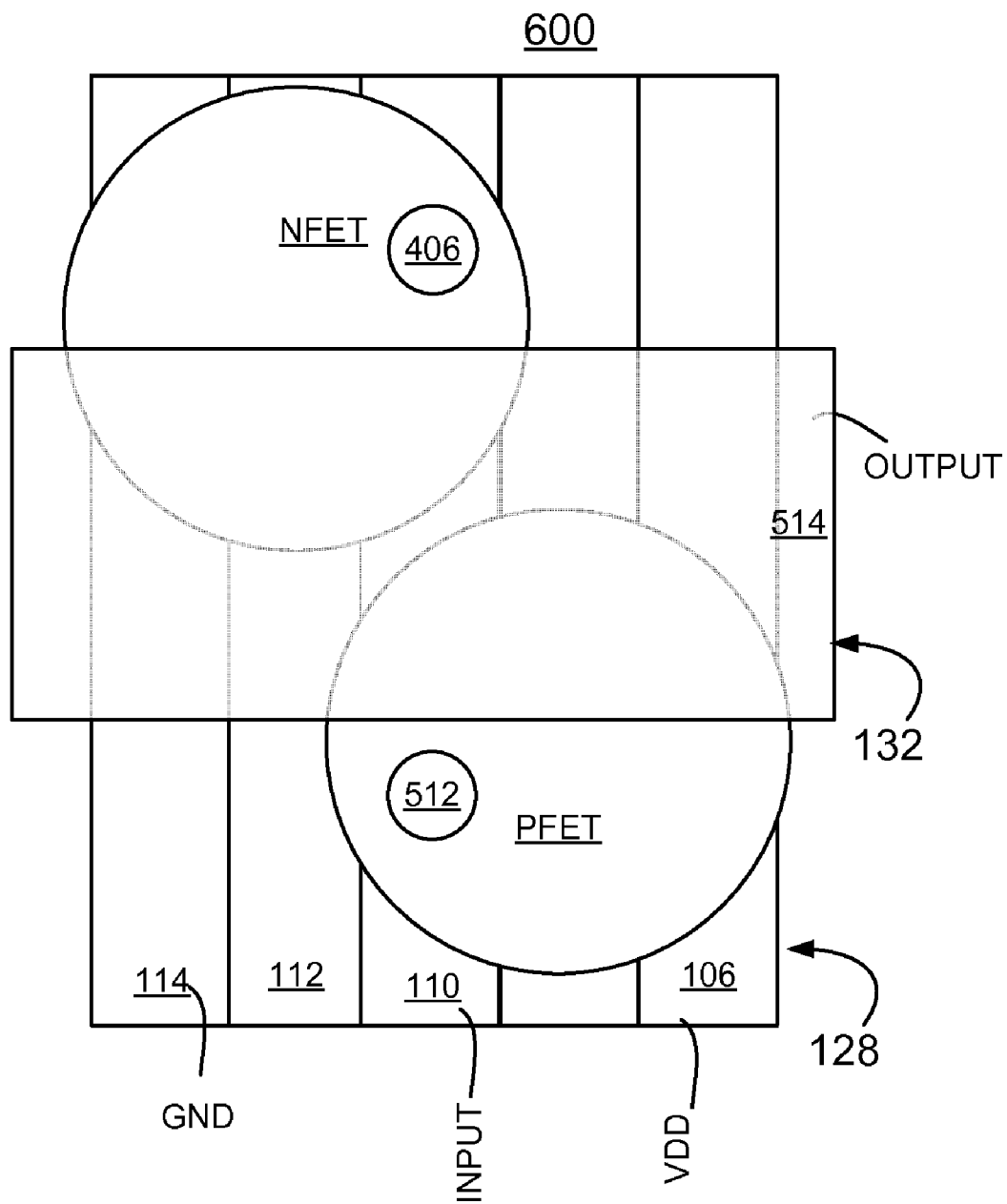

Referring to FIG. 6, a top down connections view generally designated by the reference character 600 illustrates connections to the PFET and NFET including the PFET via gate 512, and NFET via gate 406, input metal 110, the VDD metal 106, and ground GND metal 114 on the metal level 128, and the output 514 in the wiring level 132.

The metal level NFETs and PFETs of the invention advantageously are used for late design changes, similar to the existing BEOL release process but with little or no real estate area implications and far fewer new masks required than conventional processes.

While the present invention has been described with reference to the details of the embodiments of the invention shown in the drawing, these details are not intended to limit the scope of the invention as claimed in the appended claims.

What is claimed is:

1. A method for implementing vertical transistors in a back-end-of-line (BEOL) structure of a semiconductor chip comprising:
    forming a metal to metal device opening in a dielectric level extending to a predefined wiring level in the back-end-of-line (BEOL) structure of the semiconductor chip;
    forming a vertical field effect transistor (FET) by polycrystalline depositions in a stack between planes of a respective global signal routing wire in the metal to metal device opening;
    said polycrystalline depositions including sequential source deposition, channel deposition and drain deposition; and
    forming a wire via defining a gate node by forming an etched hole through said source deposition, channel deposition and drain deposition and a dielectric layer to a signal wire in the predefined wiring level in the BEOL structure; depositing a thin dielectric in said etched opening, and removing said thin dielectric from a bottom of said etched opening, and depositing a metal in said etched opening.

2. The method as recited in claim 1 wherein said vertical FET is an N-channel FET (NFET), and said sequential source deposition, channel deposition and drain deposition include a sequential deposition of an N+ doped polysilicon defining a N source, a P− doped polysilicon defining a N body, and an N+ doped polysilicon defining a N drain.

3. The method as recited in claim 2 wherein said sequential deposition of an N+ doped polysilicon defining a N source, a P− doped polysilicon defining a N body, and an N+ doped polysilicon defining a N drain has a respective thickness of approximately 0.1 µm, 0.05 µm, and 0.1 µm.

4. The method as recited in claim 1 wherein said vertical FET is an P-channel FET (PFET), and said sequential source deposition, channel deposition and drain deposition include a sequential deposition of an P+ doped polysilicon defining a P source, a N− doped polysilicon defining a P body, and an P+ doped polysilicon defining a P drain.

5. The method as recited in claim 4 wherein said sequential deposition of an P+ doped polysilicon defining a P source, a N− doped polysilicon defining a P body, and an P+ doped polysilicon defining a P drain has a respective thickness of approximately 0.1 µm, 0.05 µm, and 0.1 µm.

6. The method as recited in claim 1 wherein forming a metal to metal device opening in a dielectric level extending to a predefined wiring level in the back-end-of-line (BEOL) structure and said vertical FET being formed by polycrystalline depositions in a stack between planes of a respective global signal routing wire in the metal to metal device opening includes etching a hole in said dielectric layer in the BEOL structure, and said polycrystalline depositions with said sequential source deposition, channel deposition and drain deposition being provided in said etched hole in a said dielectric layer in the BEOL structure.

* * * * *